(12) United States Patent
Alshinnawi et al.

(10) Patent No.: US 10,765,041 B2
(45) Date of Patent: *Sep. 1, 2020

(54) AUTOMATICALLY COOLING COMPUTER SYSTEM COMPONENTS FOR SAFE SERVICING

(71) Applicant: LENOVO ENTERPRISE SOLUTIONS (SINGAPORE) PTE. LTD., Singapore (SG)

(72) Inventors: Shareef F. Alshinnawi, Apex, NC (US); Gary D. Cudak, Wake Forest, NC (US); Jeffrey S. Holland, Newton, NC (US); Bejoy J. Kochuparambil, Apex, NC (US); Aparna Vallury, Apex, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/405,411

(22) Filed: May 7, 2019

(65) Prior Publication Data

US 2019/0261538 A1 Aug. 22, 2019

Related U.S. Application Data

(63) Continuation of application No. 14/881,289, filed on Oct. 13, 2015, now Pat. No. 10,362,715.

(51) Int. Cl.
*H05K 7/20* (2006.01)
*G06F 1/20* (2006.01)

(52) U.S. Cl.
CPC ........... *H05K 7/20836* (2013.01); *G06F 1/20* (2013.01)

(58) Field of Classification Search
CPC ............................ G05B 15/02; H05K 7/20836
USPC ........................................................ 700/300
See application file for complete search history.

(56) References Cited

U.S. PATENT DOCUMENTS

| | | | |
|---|---|---|---|
| 4,748,943 A * | 6/1988 | Mayer ................... | B60K 11/00 123/198 D |
| 6,058,445 A * | 5/2000 | Chari ..................... | G06F 9/4411 709/223 |
| 6,110,213 A | 8/2000 | Vinciarelli et al. | |
| 6,338,150 B1 * | 1/2002 | Johnson .................... | G06F 1/26 714/39 |
| 6,778,386 B2 * | 8/2004 | Garnett .................... | G06F 1/183 174/16.1 |
| 7,487,955 B1 * | 2/2009 | Buercklin ................ | F22G 5/12 251/122 |
| 2005/0131584 A1 * | 6/2005 | Law ......................... | G06F 1/206 700/300 |

(Continued)

OTHER PUBLICATIONS

Borghesi et al., "MS3: a Mediterranean-Stile Job Scheduler for Supercomputers—do less when it's too hot!", IEEE, 2015, 8pg. (Year: 2015).*

(Continued)

*Primary Examiner* — Ryan D. Coyer (57) ABSTRACT

Automatically cooling computer system components for safe servicing includes: determining that a target component of a plurality of components is to be serviced; and reducing temperature of one or more components of said plurality of components if such one or more components exceeds a threshold temperature and such one or more components are within a predefined area of the target component.

21 Claims, 5 Drawing Sheets

(56) References Cited

U.S. PATENT DOCUMENTS

| | | | |
|---|---|---|---|
| 2007/0254530 A1* | 11/2007 | Martich | H01R 13/6658 439/676 |
| 2010/0138056 A1 | 6/2010 | Holmes et al. | |
| 2011/0140898 A1* | 6/2011 | Berke | G08B 5/36 340/584 |
| 2011/0189035 A1 | 8/2011 | Nakagami et al. | |
| 2013/0332757 A1 | 12/2013 | Moss et al. | |
| 2017/0105319 A1 | 4/2017 | Alshinnawi et al. | |

OTHER PUBLICATIONS

Jaffe et al., "Software Requirements Analysis for Real-Time Process Control Systems", IEEE, 1991, 18pg. (Year: 1991).*

Lee et al., "VMAP: Proactive Thermal-aware Virtual Machine Allocation in HPC Cloud Datacenters", IEEE, 2012, 10pg. (Year: 2012).*

Schmidt et al., "High-end server low-temperature cooling", IBM, 2002, 13pg. (Year: 2002).*

Crippen et al., *BladeCenter packaging, power, and cooling*, IBM Journal of Research and Development, vol. 49, No. 6, Nov. 2005, pp. 887-904, IBM Corp. Riverton, NJ, USA.

Borghesi et al., MS3: *a Mediterranean-Stile Job Scheduler for Supercomputers—do less when it's too hot!*, International Conference on High Performance Computing & Simulation (HPCS) Jul. 2015, pp. 88-95, IEEE Xplore Digital Library (online) ieee.org, DOI: 10.1109/HPCSim.2015.7237025.

Jaffe et al., *Software Requirements Analysis for Real-Time Process Control Systems*, IEEE Transactions on Software Engineering, vol. 17, No. 3, Mar. 1991, pp. 241-258, IEEE Xplore Digital Library (online) ieee.org, DOI: 10.1109/32.75414.

Lee et al., *VMAP: Proactive Thermal-aware Virtual Machine Allocation in HPC Cloud Datacenters*, 19th International Conference on High Performance Computing, Dec. 2012, 10 pages, IEEE Xplore Digital Library (online) ieee.org, DOI: 10.1109/HiPC.2012.6507478.

Schmidt et al., High-end server low-temperature cooling, IBM Journal of Research and Development, vol. 46, No. 6, Nov. 2002, pp. 739-751, IBM Corp. Riverton, NJ, USA.

\* cited by examiner

AUTOMATICALLY COOLING COMPUTER SYSTEM COMPONENTS FOR SAFE SERVICING

CROSS-REFERENCE TO RELATED APPLICATION

This application is a continuation application of and claims priority from U.S. patent application Ser. No. 14/881,289, filed Oct. 13, 2015.

BACKGROUND OF THE INVENTION

Field of the Invention

The field of the invention is data processing, or, more specifically, methods, computer devices, and products for automatically cooling computer system components for safe servicing.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

One advancement in computer systems includes data centers that provide storage and services on a massive scale. In some cases, data centers include large numbers of servers or storage configured to fit within physical housings which have physical dimensions allowing the physical housings to fit within a single rack unit. Rack units generally provide power, cooling, and a communications infrastructure for multiple rack mountable housings. However, the computer systems and associated components within a given rack mountable housing often reach temperatures that create unsafe conditions at a point that any components associated with the computer system need servicing.

SUMMARY OF THE INVENTION

Methods, computing devices, and products for automatically cooling computer system components for safe servicing are disclosed in this specification. Automatically cooling computer system components for safe servicing may include: determining that a target component of a plurality of components is to be serviced; and reducing temperature of one or more components of said plurality of components if such one or more components exceeds a threshold temperature and such one or more components are within a predefined area of the target component.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Exemplary methods, computing devices, and products for automatically cooling computer system components for safe servicing in accordance with the present invention are described with reference to the accompanying drawings, beginning with FIG. 1.

Figure 1:
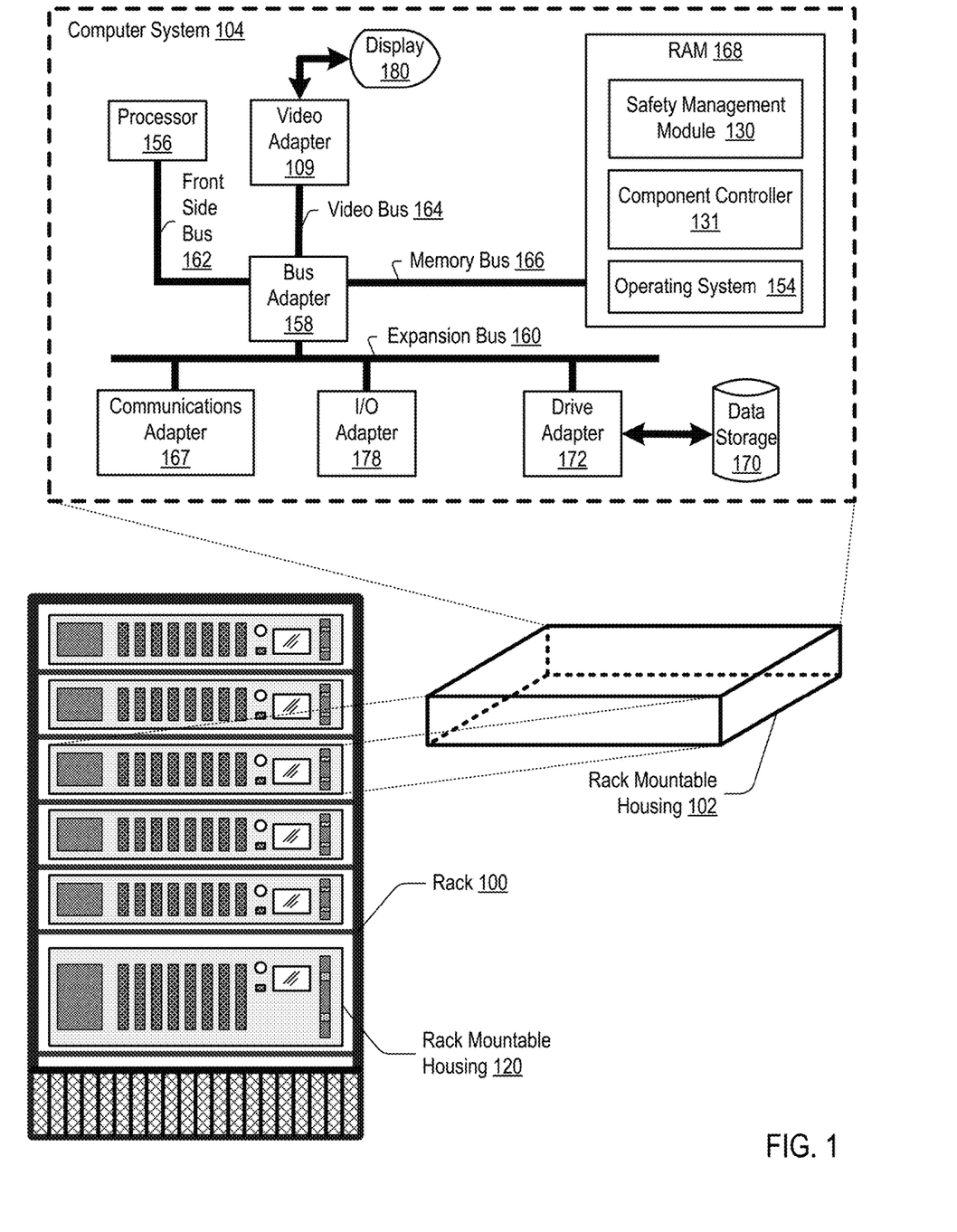
FIG. 1 sets forth a diagram of a system configured for automatically cooling computer system components for safe servicing according to embodiments of the present invention.

FIG. 1 sets forth a diagram of a system configured for automatically cooling computer system components for safe servicing according to embodiments of the present invention. The system of FIG. 1 includes a computer system (104) which includes, among other features described below, a safety management module (130) and a component controller (131).

In some implementations, the safety management module (130) may determine that a particular component of the computer system (104), or a component associated with the computer system (104), is to be serviced or is in need of servicing or replacement. Further, if components nearby or proximate to the particular component to be serviced are hot enough to create a safety hazard to a technician, then the safety management module (130) may execute operations to reduce the temperatures of the components creating the safety hazard. In other words, if the computer system includes a plurality of components, then the safety management module (130) may reduce temperatures of one or more components of the plurality of components if such one or more components exceed a temperature threshold and such one or more components are within a predefined area or region of the target component. For example, the predefined area or region may be a region of the circuit board such that components within the predefined area or region may be considered to be proximate to the target component to be serviced. Further, components or portions of a circuit board within any such predefined area of a target component to be serviced are referred to in this specification as components that are "proximate to" the target component.

In some embodiments, proximate components to a target component may be considered those components that may possibly be touched by a technician in servicing the target component to be serviced. For example, proximate components may be those components that are adjacent to the target component on the circuit board, or components within a threshold distance from the target component, where the threshold distance may be specified in accordance with a predefined area or region. In some cases, the threshold distance may be a default value, such as seven inches, or the threshold distance may be specified by a user.

After the components within a predefined area surrounding the target component to be serviced that are creating the safety hazard have been cooled, or otherwise rendered safe, a technician may safely service the particular component. Discussed below are different techniques for determining whether a given component within or associated with the computer system (104) is to be serviced.

In some implementations, the safety management module (130) may communicate with the component controller (131), where the safety management module (130) may transmit or provide commands or instructions to the component controller (131) for performing actions to reduce temperatures of components of the computer system (104) or of components associated with the computer system (104). Discussed below are different techniques for reducing temperatures of different components.

After the component to be serviced of the computer system (104) has been serviced, the safety management module (130) may transmit or provide commands or instructions to the component controller (131) for performing actions for returning to normal operation the components that were cooled or the components whose operations were modified to render them safe. Discussed below are different techniques for resuming normal operations.

In some implementations, the computer system (104) may be part of a desktop computer, a laptop computer, or, more generally, any computing device with components that may be serviced or replaced.

In an example embodiment, the computer system (104) may be implemented within a rack mountable housing (102), where many other computer systems, configured similarly to the computer system (104) may be implemented within multiple rack mountable housings of a rack (100). Further, the computer system (104) may be implemented within rack mountable housings with different physical dimensions, as depicted in one example by rack mountable housing (120). In some cases, the rack (100) may be configured to provide power, cooling, and a communications backbone for the multiple computer systems housed within the multiple rack mountable housings of the rack (100). Further, the rack (100) may be one of many racks within a data center providing storage or computing services to clients over a network.

The arrangement of physical devices and computing devices making up the exemplary system illustrated in FIG. 1 are for explanation, not for limitation. Data processing systems useful according to various embodiments of the present invention may include additional servers, routers, other devices, and peer-to-peer architectures, not shown in FIG. 1, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 1.

For further explanation, FIG. 1 sets forth a block diagram of the computer system (104), which includes a safety management module (130) for automatically cooling computer system components for safe servicing in accordance with the present invention. The computer system (104) may implement a computer with automated computing machinery.

For further explanation, FIG. 1 also sets forth a block diagram of automated computing machinery comprising an exemplary computer system (104) configured for automatically cooling computer system components for safe servicing according to embodiments of the present invention. The computer system (104) of FIG. 1 includes at least one computer processor (156) or 'CPU' as well as random access memory (168) ('RAM') which is connected through a high speed memory bus (166) and bus adapter (158) to processor (156) and to other components of the computer system (104).

Stored in RAM (168) is the safety management module (130), a module of computer program instructions for automatically cooling computer system components for safe servicing according to embodiments of the present invention. Also stored RAM (168) is the components controller (131), a module of computer program instructions for interfacing with the safety management module (130) and with one or more components within or associated with the computer system (104).

Also stored in RAM (168) is an operating system (154). Operating system (154) may communicate and interact with the safety management module (130) which is configured for automatically cooling computer system components for safe servicing according to embodiments of the present invention. Example operating systems that may be implemented include UNIX™ Linux™, Microsoft XP™, AIX™, IBM's i5/OS™, and others as will occur to those of skill in the art. The operating system (154), the safety management module (130), and the component controller (131), in the example of FIG. 1 are shown in RAM (168), but many components of such software typically are stored in non-volatile memory also, such as, for example, on a disk drive (170).

The computer system (104) of FIG. 1 includes disk drive adapter (172) coupled through expansion bus (160) and bus adapter (158) to processor (156) and other components of the computer system (104). Disk drive adapter (172) connects non-volatile data storage to the computer system (104) in the form of disk drive (170). Disk drive adapters useful in computers configured for automatically cooling computer system components for safe servicing according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer system (104) of FIG. 1 includes one or more input/output ('I/O') adapters (178). I/O adapters implement user-oriented input/output through, for example, software drivers and computer hardware for controlling output to display devices (180) such as computer display screens, as well as user input from user input devices (not shown) such as keyboards and mice. The example computer system (104) of FIG. 1 further includes a video adapter (109), which is an example of an I/O adapter specially designed for graphic output to a display device (not shown)

such as a display screen or computer monitor. Video adapter (109) is connected to processor (156) through a high speed video bus (164), bus adapter (158), and the front side bus (162), which is also a high speed bus.

The exemplary computer system (104) of FIG. 1 includes a communications adapter (167) for data communications with other computers (not shown) and for data communications with a data communications network (not shown). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for automatically cooling computer system components for safe servicing according to embodiments of the present invention include modems for wired dial-up communications, Ethernet (IEEE 802.3) adapters for wired data communications, and 802.11 adapters for wireless data communications.

Figure 2:
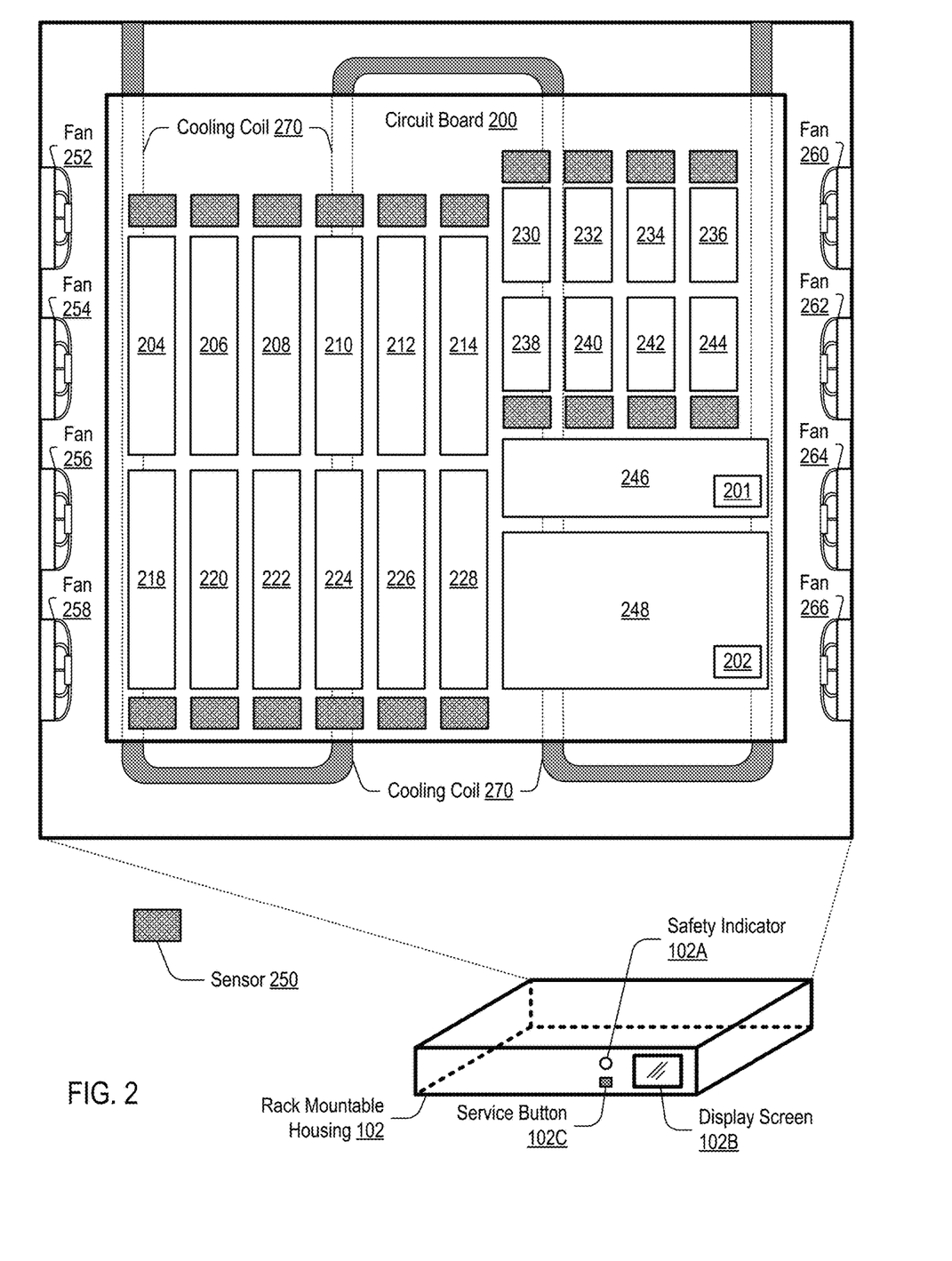
FIG. 2 sets forth an exemplary circuit board and components within a rack mountable housing, including fans and a cooling coil according to embodiments of the present invention.

FIG. 2, for further explanation, sets forth an exemplary circuit board (200) and components within a rack mountable housing (102), including fans (252, 254, 256, 258, 260, 262, 264, 266), and a cooling coil (270). In some implementations, the rack mountable housing (102) may also include a safety indicator (102A), a service button (102C), and a display screen (102B). In some cases, the safety indicator (102A) may be a light or lights.

Further in this example, the circuit board (200) may include an implementation of the computer system (104) depicted in FIG. 1, which implements an exemplary method for automatically cooling computer system components for safe servicing according to embodiments of the present invention.

In this implementation, the circuit board (200) includes multiple components (204, 206, 208, 210, 212, 214, 218, 220, 222, 224, 226, 228, 230, 232, 234, 236, 238, 240, 242, 244, 246, 248). In some examples, the multiple components (204-248) may comprise different types of components that may be serviced or replaced. In some cases, the components (204-248) may be serviced while the computer system (104) is operating. In other words, the components (204-248) may be hot-swappable components, which may be, for example, different types of memory. More generally, the components (204-248) may be any type of hardware component that may be replaced or serviced.

In this implementation, different techniques may be used in determining temperatures for the components (204-248) of the computer system (104) or in determining temperatures or operating conditions for components associated with the computer system (104), such as the fans (252-266) and the cooling coil (270). For example, the circuit board may be equipped with sensors (250) that may be installed at different locations, as depicted by the sensors installed proximate to components (204-246). The sensors (250) may be one or more types of sensors for measuring temperature. In this example, the temperature information from the sensors (250) may be provided to the safety management module (130) periodically, aperiodically, or upon request. Further, in some cases, the sensors (250) may provide temperature information for one or more components, or a temperature of components within a predefined area of the circuit board (200)—where the components within the predefined area of the circuit board (200) may include portions of the circuit board itself.

In other cases, temperatures of the components may be determined based at least in part on sensors that may be implemented as part of a given component, such as the sensor (201) implemented within the component (246) and the sensor (202) implemented within the component (248). In one example, the sensor (201) and the sensor (202) may be the same type or different types of thermal sensors. In this example, the temperature information from the sensors (201, 202) may be provided to the safety management module (130) periodically, aperiodically, or upon request.

In some implementations, the safety management module (130) may initiate operations that provide for safe servicing conditions other than, or in addition to, reducing temperatures of components. For example, if the safety management module (130) determines that a component to be serviced is not part of the circuit board (200), but is rather associated with and proximate to the circuit board (200), the safety management module (130) may initiate operations to render the associated components safe. In other words, the safety management module (130), in addition to reducing temperatures of components proximate to a component to be serviced, may also render safe other proximate components such as fans, cooling coils, or other hardware elements within the rack mountable housing (102).

In this example, if the safety management module (130) determines that the component to be serviced is the fan (262), then the safety management module (130) may stop the fans (260, 264, 266) that may be determined to be proximate to the fan (262) to be serviced. Further in this example, in addition to stopping the fans (260, 264, 266), the safety management module (130) may also reduce the temperature of any of the circuit board components proximate to the fan (262) to be serviced if the temperatures of those components exceed a threshold temperature. In different examples, the threshold temperature for what is considered safe may be specified by default or adjustable through a user interface or configuration file.

Further in this example, the safety management module (130) may determine which fans are proximate to the fan to be serviced based at least upon a layout of components of the rack mountable housing (102). In other examples, if no layout of the components of the rack mountable housing (102) is available, default safety operations taken by the safety management module (130) may include turning off all fans (252-266) within the rack mountable housing (102).

As another example, the safety management module (130) may determine that a given component within the rack mountable housing (102) to be serviced is the cooling coil (270). In this example, the temperature of the cooling coil (270) may be cold enough that if touched by a technician, the technician may be injured. Therefore, in this case, the safety management module (130) may initiate operations to increase the temperature of the cooling coil (270) that may run through the rack mountable housing (102). In this example, the safety management module (130) may generate a command to turn off or warm up the cooling coil (270) to exceed a lower threshold temperature such that a technician that made contact with the cooling coil (270) would likely not suffer any injury.

In other words, the safety management module (130) may create a safe servicing environment within the rack mountable housing (102) based on reducing temperatures of components, increasing temperatures of components, or based on modifying the mechanical performance of hardware components within the rack mountable housing (102), or create a safe servicing environment through some combination of each of these operations.

As described in greater detail below, the safety management module (130) may implement different techniques to create a safe environment for servicing components within the rack mountable housing (102).

Figure 3:
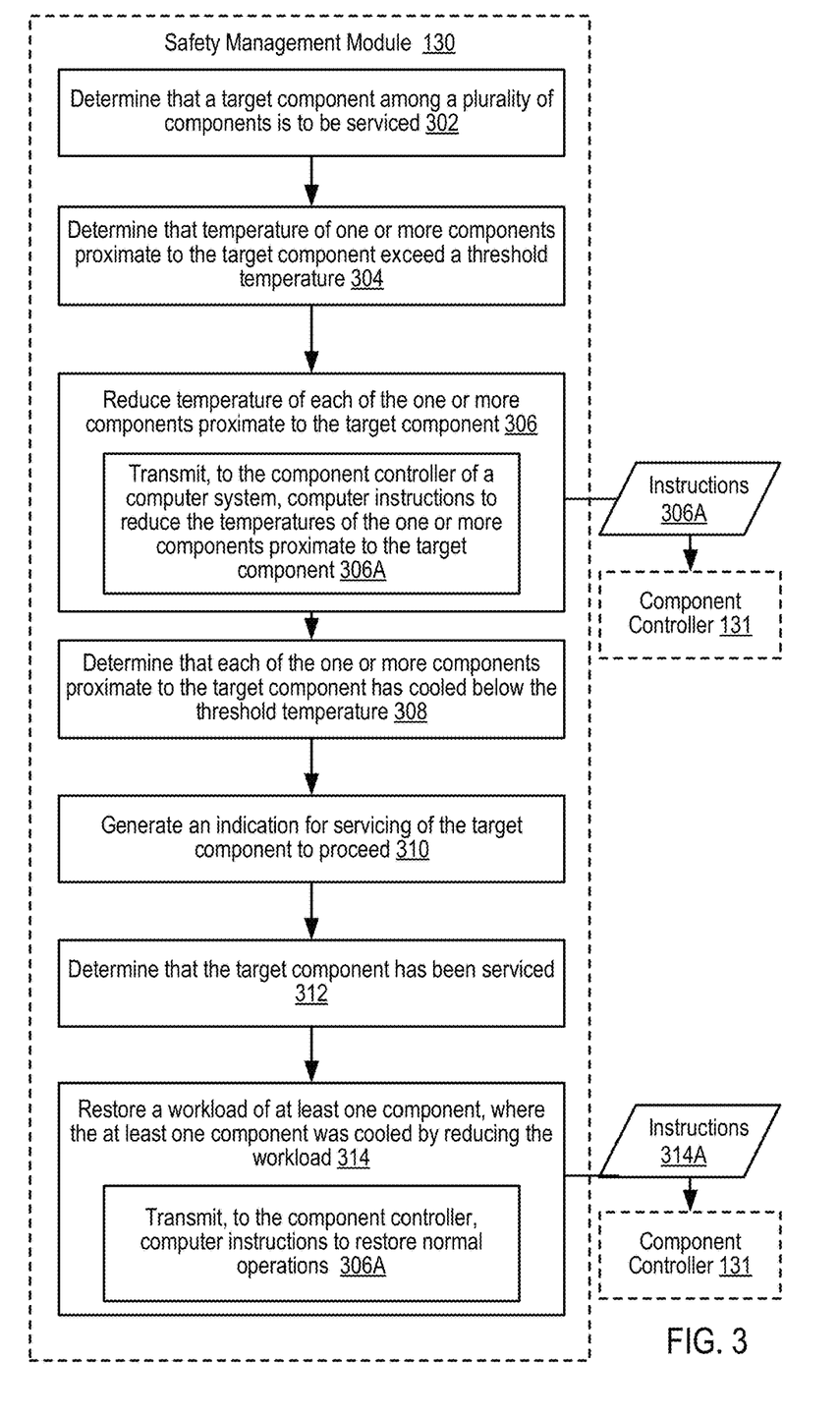
FIG. 3 sets forth a flow chart illustrating an exemplary method for automatically cooling computer system components for safe servicing according to embodiments of the present invention.

FIG. 3, for further explanation, sets forth a flow chart illustrating an exemplary method for automatically cooling computer system components for safe servicing according to embodiments of the present invention that includes: determining (302) that a target component, which may be among a plurality of components, is to be serviced; determining (304) that a temperature of one or more components proximate to the target component exceeds a threshold temperature; and reducing (306) temperatures of each of the one or more components proximate to the target component.

In other words, in some implementations, for a computer system including a plurality of components, the safety management module (130) may automatically cool computer system components for safe servicing according to embodiments of the present invention, where steps of the safety management module (130) may include: determining that a target component of a plurality of components is to be serviced; and reducing temperature of one or more components of said plurality of components if such one or more components exceeds a threshold temperature and such one or more components are within a predefined area of the target component.

In some implementations, determining (302) that a target component is to be serviced may include receiving an indication of upcoming servicing from user-level system management software. For example, if a technician determines that a particular component of the circuit board (200) is to be serviced, then the technician may create a task to service the particular component, where the creation of the task results in sending the safety management module (130) an indication or message that the particular component is to be serviced. The message or indication to the safety management module (130) may also include an estimated time for servicing, and an estimated length of servicing—information which may be used in determining a length of time for maintaining safe servicing conditions before bringing the computer system (104) back up to normal after safety measures and operations have been performed. Other techniques for determining if a component is to be serviced are discussed below.

In some implementations, the determining (304) that temperatures of one or more components proximate to the target component exceed a threshold temperature may be performed using different techniques. For example, as discussed below with regard to FIG. 4, determining which components are proximate to the target component may include accessing a circuit board layout with information describing locations of the components. Based at least upon the circuit board layout, the safety management module (130) may determine one or more components that may be proximate to the target component. In some cases, proximity may be based on components being adjacent to a target component, or be based on a specified distance of a component to the target component.

Figure 5:
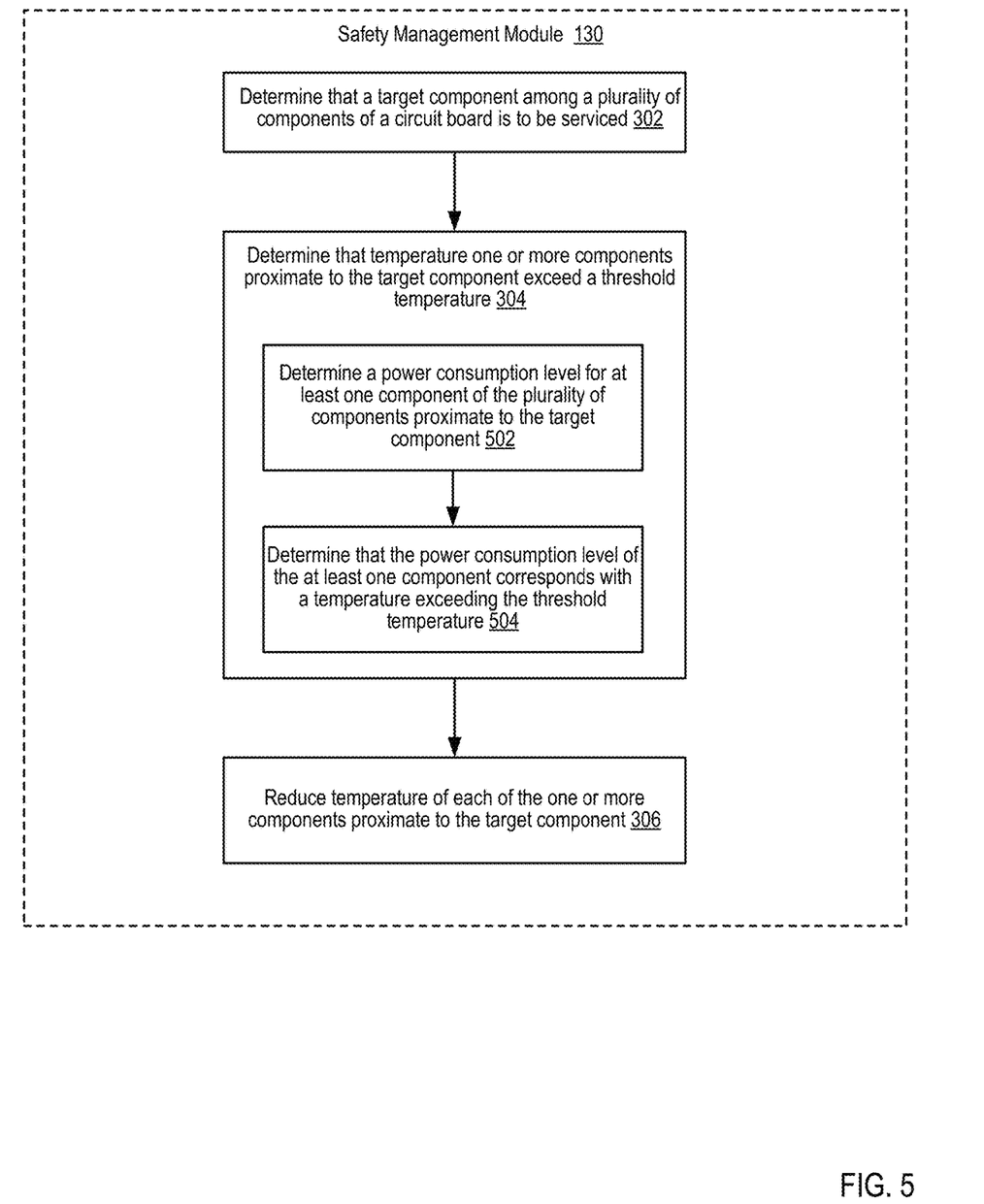
FIG. 5 sets forth a flow chart illustrating a further exemplary method for automatically cooling computer system components for safe servicing according to embodiments of the present invention.

Further, for the one or more components proximate to the target component, the temperatures may be determined using different techniques, described in greater detail with regard to FIG. 5. In one example, the safety management module (130) may access temperature information for each of the one or more components proximate to the target component. In this example, the safety management module (130) may access a temperature reading for a thermal sensor corresponding to a given proximate component, or the safety management module (130) may query the given proximate component to request a temperature reading from a thermal sensor integrated within the given proximate component.

In some implementations, the reducing (306) of temperatures may be performed by the safety management module (130) transmitting (306A), to the component controller (131) of a computer system (104), computer instructions (306A) to reduce the temperature of the one or more components proximate to the target component. As discussed above, the safety management module (130) may also render the space within a rack mountable housing (102) safe for servicing by modifying the physical operation of hardware components within the rack mountable housing (102), for example, by turning off one or more fans (252-266) or by changing the temperature of a cooling coil (270). In such an example, the component controller (131) may include controllers for the fans (252-256) or the cooling coil (270), among other hardware elements within the rack mountable housing, and the computer instructions may include instructions to turn off the fans (252-256) or to bring the temperature of the cooling coil (270) to a safe temperature.

In some implementations, to reduce the temperature of a component of the circuit board (200), the computer instructions (306A) may be sent to the component controller (131) to increase the airflow around the target component to be serviced. For example, the safety management module (130) may access layout information of the components within the rack mountable housing (102) to determine which fans produce an airflow that is directed toward or nearby the target component. For example, if the target component is component (204), then the safety management module (130) may increase the fan speed of fans (252, 254, 260, 262) based on these fans producing airflows that are directed toward the target component (204). In other examples, the safety management module (130) may increase the fan speed of all fans within the safety management module (130).

In some implementations, to reduce the temperature of a component of the circuit board (200), the computer instructions (306A) may include instructions to an operating system instructing the operating system to offload the workload of the component, thereby rendering the component idle. After the component is rendered idle, the component may begin to cool in response. In other examples, the computer instructions (306A) may instruct the operating system to reduce or throttle, but not eliminate, a workload, where the lower workload may result in a lowered temperature that does not exceed the threshold temperature.

In some implementations, an amount of throttling for a given component may be adjusted based on an expected reduction in temperature corresponding to the amount of throttling. For example, the workload may be reduced corresponding with an expected number of degrees of temperature reduction of the at least one component corresponding to the workload reduction.

The flow chart of FIG. 3 further illustrates that an exemplary method for automatically cooling computer system components for safe servicing according to embodiments of the present invention may also include: determining (308) that each of the one or more components proximate to the target component has cooled below the threshold temperature; generating (310) an indication for servicing of the target component to proceed; determining (312) that the target component has been serviced; and restoring (314) normal operating conditions, for example, by restoring a workload for a proximate component to the target component in the case that the proximate component was cooled by reducing a workload.

In some implementations, determining (308) that the one or more components proximate to the target component has cooled below the threshold temperature may be similar to determining (304) that the temperatures of the one or more components proximate to the target component exceed the threshold temperature. In other words, the safety management module (130) may access temperature information for each of the one or more components proximate to the target component. In this example, the safety management module (130) may access a temperature reading for a thermal sensor corresponding to a given proximate component, or the safety management module (130) may query the given proximate component to request a temperature reading from a thermal sensor implemented as part of the given proximate component.

In some implementations, generating (310) an indication for servicing of the target component to proceed may include the safety management module (130) turning on a physical indication to a technician. For example, a physical indication to a technician may include turning on a safety indicator light (102A) that may be visible on the rack mountable housing (102) that indicates that conditions within the rack mountable housing (102) are safe for servicing. For example, the safety indicator (102A) may be changed from red to green to indicate safe servicing conditions. More generally, some indication generated by the safety indicator (102A) may be defined and understood by a technician to indicate safe servicing conditions.

In other examples, the safety management module (130) may display a message on a service display screen (102B) of the rack mountable housing. In other examples, the safety management module (130) may display a message, or send a transmission to a user-level system management software (not shown), that conditions within the rack mountable housing (102) are safe for servicing. In other examples, the safety management module (130) may send an indication of safe servicing through another communication channel, for example, by sending a text message to a telephone number associated with a technician service queue. In other cases, the safety management module (130) may indicate safety to service the target component by updating a task service order for servicing the target component, for example by updating the task service order with a timestamped message indicating that conditions within the rack mountable housing (102) are safe for servicing.

In some implementations, determining (312) that the target component has been serviced may be performed using different techniques. For example, if the target component had failed, then the safety management module (130) may wait for a length of time corresponding to a standard service time for the type of component being serviced, and after the length of time has elapsed, the safety management module (130) may attempt to query or ping the replacement or serviced component. If the safety management module (130) receives a status response indicating normal operation, then the safety management module (130) may determine that the component has been serviced. In other examples, the safety management module (130) may determine that servicing is complete based at least on detecting that a cover to the rack mountable housing (102) having been removed and then re-installed. In other examples, the safety management module (130) may receive an indication, or event notification, from another software process, for example, from user-level system management software indicating that the component has been serviced and is back online.

Further in this example, the restoring (314) of normal operations may include transmitting or providing, to the component controller (131) computer instructions (314A) to restore normal operations. For example, the safety management module (130) may instruct, directly or indirectly through the operating system, the one or more components proximate to the target component to resume normal operations. In other examples, restoring (314) normal operations may include restoring workloads, turning on fans (252-266), or bringing the temperature of the cooling coil (270) back to normal levels.

Additional example techniques for determining (302) that a target component is to be serviced, determining (304) that temperatures of proximate components exceed a threshold temperature, determining (308) that proximate components have cooled below a threshold temperature, determining (312) that proximate components have been serviced, and restoring (314) normal operations are discussed below with regard to FIGS. 4 and 5.

Figure 4:
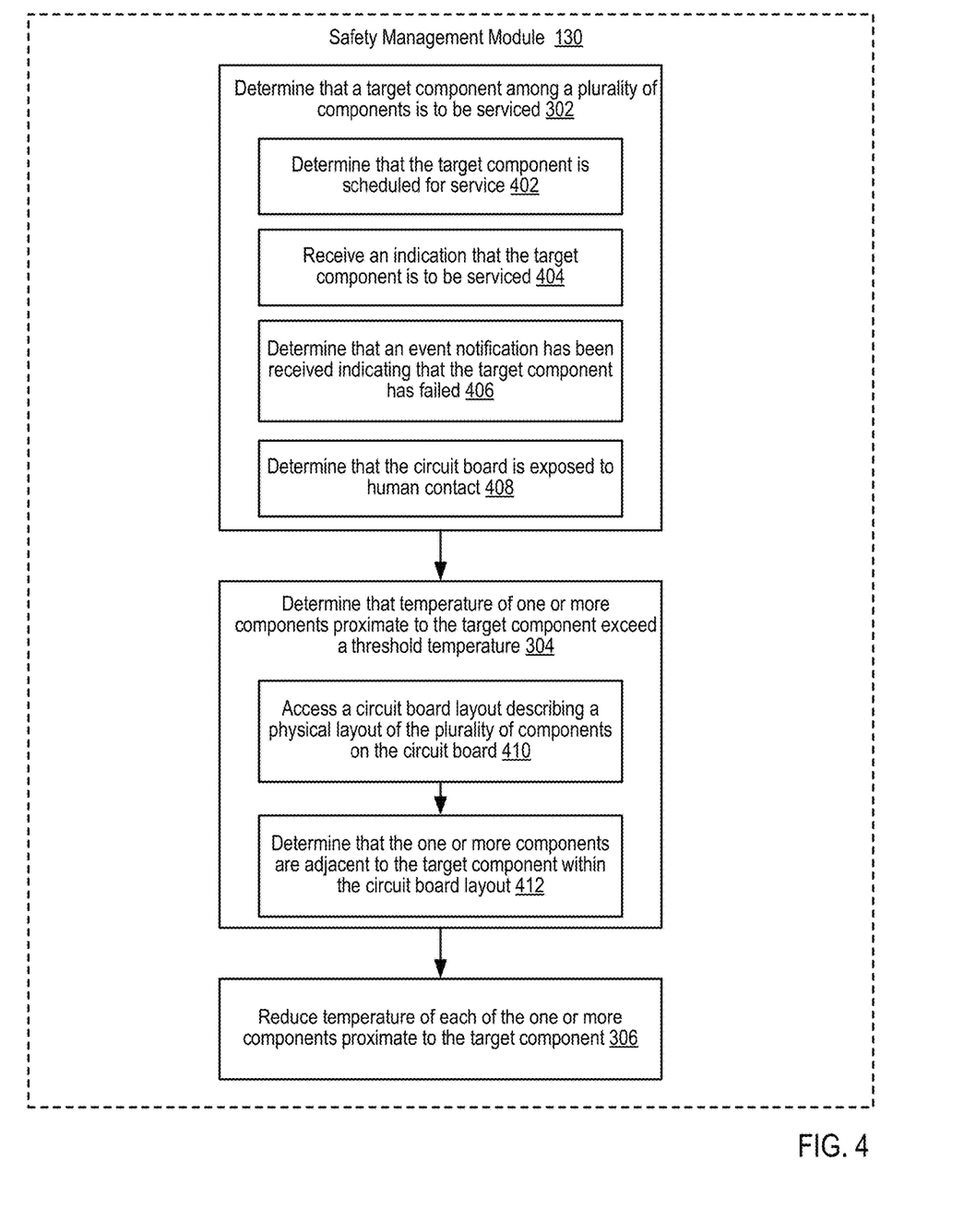
FIG. 4 sets forth a flow chart illustrating a further exemplary method for automatically cooling computer system components for safe servicing according to embodiments of the present invention.

FIG. 4, for further explanation, sets forth a flow chart illustrating a further exemplary method for automatically cooling computer system components for safe servicing according to embodiments of the present invention. The method of FIG. 4 is similar to the method of FIG. 3 in that the method of FIG. 4 includes: determining (302) that a target component, which may be among a plurality of components, is to be serviced; determining (304) that a temperature of one or more components proximate to the target component exceeds a threshold temperature; and reducing (306) temperatures of each of the one or more components proximate to the target component.

The method of FIG. 4 differs from the method of FIG. 3, however, in that the method of FIG. 4 depicts several techniques for determining (302) that a target component is to be serviced, and several techniques for determining (304) that temperatures of one or more components proximate to the target component exceed a threshold temperature.

In some implementations, determining (302) that a target component is to be serviced may include determining (402) that the target component is scheduled for service. For example, the safety management module (130) may access a servicing schedule indicating dates, and in some cases, times, on which a given component is to be serviced. In this way, the safety management module (130) may determine a respective point in time, or window of time, within which a respective component of the components within a rack mountable housing (102) is to be serviced. In some examples, the safety management module (130) may have access to times of servicing, and not windows of time of servicing, and may determine based on a length of elapsed time, or based on a pattern of lengths of elapsed time for multiple instances of servicing, an estimated window of time for which to create safe servicing conditions within the rack mountable housing (102), as described with regard to steps (302)-(308).

In some implementations, determining (302) that a target component is to be serviced may include receiving (404) an indication that the target component is to be serviced. For example, a technician, as discussed above with regard to FIG. 3, may operate user-level system management software to create a servicing task for the target component, and the user-level system management software may, in response, transmit a message to the safety management module (130) with information describing the target component to be serviced, and in some cases, information with regard to when the target component is to be serviced and an estimated length of time for the servicing. In other examples, a technician may depress or activate a service button (102C) on the housing of the rack mountable housing (102) to indicate that a component is to be serviced, and in response, a message or indication is transmitted to the safety management module (130) to begin operations for creating a safe servicing environment, as described with regard to steps (302)-(308).

In some implementations, determining (302) that a target component is to be serviced may include determining (406) that an event notification has been received indicating that the target component has failed or determining that the target component is non-responsive. For example, any given component that is part of computer system (104), or that is associated with computer system (104), such as the component within the same rack mountable housing (102), may be configured to send a status message indicating a failure or need for servicing. In other examples, the safety management module (130) may, periodically or aperiodically, request status information from a given component, and if the status information includes an indication that servicing is needed, or if no response is received, then the safety management module (130) may determine that the given component is in need of servicing. Further, given a determination that the given component is in need of servicing, the safety management module (130) may generate an indication that the given component is in need of servicing, as described above.

In some implementations, determining (302) that a target component is to be serviced may include determining (408) that the circuit board (200) of the computer system (104) or other internal components of the rack mountable housing (102) are exposed to human contact. For example, the rack mountable housing (102) may have a sensor that indicates when a cover has been removed from the rack mountable housing (102), thereby exposing the components within the rack mountable housing (102).

Further as depicted in FIG. 4, are several techniques for determining (304) that temperatures of one or more components proximate to the target component exceed a threshold temperature. In some implementations, determining (304) that temperatures of one or more components proximate to the target component exceed a threshold temperature may include: accessing (410) a circuit board layout describing a physical layout of the multiple components of the circuit board (200); and determining (412) that the one or more components determined to exceed a threshold temperature are adjacent to the target component within the circuit board layout.

In some implementations, the circuit board layout may be a configuration file that is accessible to the safety management module (130), and in other cases, the circuit board layout may be received from user-level system management software. In other implementations, instead of or in addition to a circuit board layout, the safety management module (130) may access a component mapping file indicating, for each given component within the circuit board or within the rack mountable housing (102), a list of one or more components that are proximate to the given component. In this way, the safety management module (130) may use the component mapping file to identify which component or components, for a given target component, to control or modify to bring to a safe servicing condition.

FIG. 5, for further explanation, sets forth a flow chart illustrating a further exemplary method for automatically cooling computer system components for safe servicing according to embodiments of the present invention. The method of FIG. 5 is similar to the method of FIG. 3 in that the method of FIG. 5 includes: determining (302) that a target component, which may be among a plurality of components, is to be serviced; determining (304) that a temperature of one or more components proximate to the target component exceeds a threshold temperature; and reducing (306) temperatures of each of the one or more components proximate to the target component.

The method of FIG. 5 differs from the method of FIG. 3, however, in that the method of FIG. 5 depicts additional steps for determining (304) that temperatures for one or more components proximate to the target component exceed a threshold temperature.

In some implementations, determining (304) that temperatures for one or more components proximate to the target component exceed a threshold temperature may include determining (502) a power consumption level for at least one component proximate to the target component; and determining (504) that the power consumption level of the at least one component corresponds with a temperature exceeding the threshold temperature.

In other implementations, for the one or more components proximate to the target components that are determined to exceed a threshold temperature, the technique used for determining a respective threshold temperature of a respective component may be based on different respective techniques. In other words, different combinations of techniques for determining temperatures may be used by the safety management module (130) to determine that the one or more one or more components proximate to the target component exceed the threshold temperature.

In some implementations, the safety management module (130) may, instead of determining a temperature for proximate components to a target component to be serviced, may use the circuit board layout, or the component mapping file, or both, to determine components proximate to the target component, and idle or throttle each of the proximate components regardless of their respective temperatures. This technique may be useful in the case that one or more of the proximate components to the target components do not have corresponding thermal sensor information.

Exemplary embodiments of the present invention are described largely in the context of a fully functional computer system for automatically cooling computer system components for safe servicing. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, computer systems, and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing computer system, or other device to cause a series of operational steps to be performed on the computer, other programmable computer system or other device to produce a computer implemented process, such that the instructions which execute on the computer, other programmable computer system, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method comprising:
   by first computer program instructions executed by a computer system, said computer system comprising a plurality of components:
   determining that a target component of said plurality of components is to be serviced;
   determining that at least one component of said plurality of components within a predefined area of the target component exceeds a threshold temperature, wherein the predefined area is a predefined region of a circuit board; and
   in response to the determination that the at least one component of said plurality of components within the predefined area of the target component exceeds a threshold temperature, automatically reducing the temperature of the at least one component of said plurality of components.

2. The method of claim 1, further comprising:
   determining that the one or more components within the predefined area of the target component have cooled below the threshold temperature; and
   generating an indication for servicing of the target component to proceed.

3. The method of claim 1, wherein reducing the temperature further comprises reducing a workload of at least one component within the predefined area of the target component.

4. The method of claim 3, further comprising:
   determining that the target component has been serviced; and
   restoring the workload of the at least one component.

5. The method of claim 1, wherein reducing the temperatures further comprises increasing an airflow directed toward at least one component within the predefined area of the target component.

6. The method of claim 1, further comprising:
   determining that the one or more components are within the predefined area of the target component, wherein the determining that the one or more components are within the predefined area of the target component comprises:
   accessing a circuit board layout describing a physical layout of the plurality of components on a circuit board of the computer system; and
   determining that the one or more components are adjacent to the target component within the circuit board layout.

7. The method of claim 1, wherein determining that the target component among the plurality of components is to be serviced comprises:
   determining that the target component is scheduled for service,
   receiving an indication that the target component is to be serviced,
   determining that an event notification has been received indicating that the target component has failed, or
   determining that a circuit board comprising the plurality of components is exposed to human contact.

8. The method of claim 1, further comprising:
   determining that the one or more components within the predefined area of the target component exceed the threshold temperature, wherein said determining comprises:
   determining a power consumption level for at least one component of the one or more components within the predefined area of to the target component; and
   determining that the power consumption level of the at least one component corresponds with a temperature exceeding the threshold temperature.

9. A computer system comprising a computer processor, a computer memory operatively coupled to the computer processor, the computer memory having disposed within it computer program instructions that, when executed by the computer processor, cause the computer system to carry out the steps of:
   determining that a target component of said plurality of components is to be serviced;
   determining that at least one component of said plurality of components within a predefined area of the target component exceeds a threshold temperature, wherein the predefined area is a predefined region of a circuit board; and
   in response to the determination that the at least one component of said plurality of components within the predefined area of the target component exceeds a threshold temperature, automatically reducing the temperature of the at least one component of said plurality of components.

10. The computer system of claim 9, wherein the computer program instructions, when executed by the computer processor, cause the computer system to further carry out the steps of:
    determining that the one or more components within the predefined area of the target component has cooled below the threshold temperature; and
    generating an indication for servicing of the target component to proceed.

11. The computer system of claim 9, wherein reducing the temperature further comprises reducing a workload of at least one component within the predefined area of the target component.

12. The computer system of claim 9, wherein the computer program instructions, when executed by the computer processor, cause the computer system to further carry out the steps of:
    determining that the target component has been serviced; and
    restoring the workload of the at least one component.

13. The computer system of claim 9, wherein reducing the temperatures further comprises increasing an airflow directed toward at least one component within the predefined area of the target component.

14. The computer system of claim 9, wherein the computer program instructions, when executed by the computer processor, cause the computer system to further carry out the steps of:
    determining that the one or more components are within the predefined area of the target component, wherein the determining that the one or more components are within the predefined area of the target component comprises:
    accessing a circuit board layout describing a physical layout of the plurality of components on a circuit board of the computer system; and
    determining that the one or more components are adjacent to the target component within the circuit board layout.

15. The computer system of claim 9, wherein the computer program instructions, when executed by the computer processor, cause the computer system to further carry out the steps of:

determining that the target component is scheduled for service, receiving an indication that the target component is to be serviced, determining that an event notification has been received indicating that the target component has failed, or determining that a circuit board comprising one or more of the plurality of components is exposed to human contact.

16. A computer program product disposed upon a computer readable storage medium, the computer program product comprising computer program instructions that, when executed, cause a computer system to carry out the steps of:

determining that a target component of said plurality of components is to be serviced;

determining that at least one component of said plurality of components within a predefined area of the target component exceeds a threshold temperature, wherein the predefined area is a predefined region of a circuit board; and in response to the determination that the at least one component of said plurality of components within the predefined area of the target component exceeds a threshold temperature, automatically reducing the temperature of the at least one component of said plurality of components.

17. The computer program product of claim 16, wherein the computer readable medium comprises a signal medium.

18. The computer program product of claim 16, wherein the computer readable medium comprises a storage medium.

19. The computer program product of claim 16, wherein the computer program instructions, when executed, cause the computer system to further carry out the steps of:

determining that the one or more components within the predefined area of the target component has cooled below the threshold temperature; and generating an indication for servicing of the target component to proceed.

20. The computer program product of claim 16, wherein reducing the temperature further comprises reducing a workload of at least one component within the predefined area the target component.

21. A method comprising:

by first computer program instructions executed by a computer system, said computer system comprising a plurality of components:

determining that a target component of said plurality of components is to be serviced;

determining that at least one component of said plurality of components within a predefined area of the target component exceeds a threshold temperature, wherein the predefined area is determined by a threshold distance from the target component; and in response to the determination that the at least one component of said plurality of components within the predefined area of the target component exceeds a threshold temperature, automatically reducing the temperature of the at least one component of said plurality of components.

* * * * *